(12) United States Patent
Novotny et al.

(10) Patent No.: US 7,375,874 B1
(45) Date of Patent: May 20, 2008

(54) LIGHT MODULATOR WITH INTEGRATED DRIVE AND CONTROL CIRCUITRY

(75) Inventors: Vlad Novotny, Los Gatos, CA (US);
Bharat Sastri, Pleasanton, CA (US);
Chitranjan N. Reddy, Los Altos Hills, CA (US)

(73) Assignee: Active Optical MEMS Inc., Fremont, CA (US)

( * ) Notice: Subject to any disclaimer, the term of this patent is extended or adjusted under 35 U.S.C. 154(b) by 0 days.

(21) Appl. No.: 11/472,954

(22) Filed: Jun. 21, 2006

Related U.S. Application Data

(63) Continuation of application No. 11/286,075, filed on Nov. 23, 2005, now Pat. No. 7,075,701, which is a continuation of application No. 10/861,963, filed on Jun. 4, 2004, now Pat. No. 7,015,885, which is a continuation-in-part of application No. 10/394,835, filed on Mar. 22, 2003, now Pat. No. 6,914,711.

(60) Provisional application No. 60/476,681, filed on Jun. 6, 2003.

(51) Int. Cl.
*G02B 26/00* (2006.01)
*H01L 21/00* (2006.01)
*H01L 29/84* (2006.01)
*C23F 1/00* (2006.01)

(52) U.S. Cl. ............... 359/291; 359/395; 438/50; 216/2; 257/415

(58) Field of Classification Search ............ 359/223, 359/224, 290–292, 295, 298; 438/50, 53; 216/2; 257/415
See application file for complete search history.

(56) References Cited

U.S. PATENT DOCUMENTS

| | | | |
|---|---|---|---|
| 3,886,310 | A | 5/1975 | Guldberg et al. |
| 3,896,338 | A | 7/1975 | Nathanson et al. |
| 4,229,081 | A | 10/1980 | Jones et al. |
| 4,229,732 | A | 10/1980 | Hartstein et al. |
| 4,492,435 | A | 1/1985 | Banton et al. |
| 4,566,935 | A | 1/1986 | Hornbeck |
| 4,662,746 | A | 5/1987 | Hornbeck |
| 5,018,256 | A | 5/1991 | Hornbeck |
| 5,535,047 | A | 7/1996 | Hornbeck |
| 5,610,757 | A | 3/1997 | Ji et al. |
| 5,739,941 | A | 4/1998 | Knipe et al. |
| 5,808,780 | A | 9/1998 | McDonald |
| 5,943,157 | A | 8/1999 | Florence et al. |
| 6,060,336 | A | 5/2000 | Wan |
| 6,384,952 | B1 | 5/2002 | Clark et al. |

(Continued)

OTHER PUBLICATIONS

U.S. Appl. No. 10/861,963, filed Jun. 4, 2004, Vlad J. Novotny.

(Continued)

*Primary Examiner*—Huy Mai
*Assistant Examiner*—Jack Dinh
(74) *Attorney, Agent, or Firm*—Carr & Ferrell LLP

(57) ABSTRACT

Described are MEMS mirror arrays monolithically integrated with CMOS control electronics. The MEMS arrays include polysilicon or polysilicon-germanium components that are mechanically superior to metals used in other MEMS applications, but that require process temperatures not compatible with conventional CMOS technologies. CMOS circuits used with the polysilicon or polysilicon-germanium MEMS structures use interconnect materials that can withstand the high temperatures used during MEMS fabrication. These interconnect materials include doped polysilicon, polycides, and tungsten metal.

17 Claims, 12 Drawing Sheets

U.S. PATENT DOCUMENTS

| | | |
|---|---|---|
| 6,541,831 B2 | 4/2003 | Lee et al. |
| 6,593,677 B2 | 7/2003 | Behin et al. |
| 6,612,029 B2 | 9/2003 | Behin et al. |
| 6,758,983 B2 | 7/2004 | Conant et al. |
| 6,781,208 B2 | 8/2004 | Okumura |
| 6,888,521 B1 | 5/2005 | Richards |
| 6,914,711 B2 | 7/2005 | Novotny |
| 7,075,701 B2 * | 7/2006 | Novotny et al. ............ 359/291 |
| 2002/0005976 A1 | 1/2002 | Behin et al. |
| 2002/0127760 A1 | 9/2002 | Yeh et al. |
| 2003/0218793 A1 | 11/2003 | Soneda et al. |
| 2004/0032634 A1 | 2/2004 | Hah et al. |

OTHER PUBLICATIONS

U.S. Appl. No. 11/286,075, filed Nov. 23, 2005, Vlad Novotny.

"Why is the Texas Instruments Digital Micromirror Device (DMD) so Reliable?" Downloaded at http://www.ti.com/dip. 7 pages.

"Supercritical Carbon Dioxide Solvent Extraction from Surface-Micromachined Micromechanical Structures." SPIE Micromachining and Microfabrication, Oct. 1996. 12 pgs.

* cited by examiner

LIGHT MODULATOR WITH INTEGRATED DRIVE AND CONTROL CIRCUITRY

CROSS-REFERENCE TO RELATED APPLICATIONS

This application is a continuation of U.S. patent application Ser. No. 11/286,075 entitled "Light Modulator With Integrated Drive and Control Circuitry," filed Nov. 23, 2005, which is a continuation of U.S. Pat. No. 7,015,885 entitled "MEMS Devices Monolithically Integrated with drive and Control Circuitry," filed Jun. 4, 2004, which is a continuation-in-part of U.S. Pat. No. 6,914,711 entitled "Spatial Light Modulator with Hidden Comb Actuator," filed Mar. 22, 2003, which claims the benefit of provisional application Ser. No. 60/476,681 filed Jun. 6, 2003, and entitled "MEMS (Micro Electro Mechanical Systems) Devices Monolithically Integrated with CMOS (Complementary Metal Oxide Semiconductors)."

BACKGROUND

Micro Electro Mechanical Systems (MEMS) devices are being deployed in increasing numbers of applications, such as accelerometers, Radio Frequency (RF) circuits, optical micro mirrors and biotech. One of the primary requirements of modem MEMS applications is the integration of control circuitry, typically implemented in Complementary Metal Oxide Semiconductor (CMOS) technology with the MEMS structures. Such integration has been difficult for a number of reasons, not least of which is the incompatibility of standard CMOS processes with some MEMS processes.

A class of MEMS devices commonly referred to as Spatial Light Modulators (SLMs) has found numerous applications in the areas of optical information processing, projection displays, video and graphics monitors, televisions, maskless lithography, and electrophotographic printing. SLMs modulate incident light in a spatial pattern to form an image corresponding to an electrical or optical input. The incident light may be modulated in its phase, intensity, polarization, or direction. The light modulation may be achieved with a variety of materials exhibiting various reflective, refractive, diffractive, electro-optic or magneto-optic effects, or with materials that modulate light by surface deformation.

An SLM typically includes an area or linear array of addressable picture elements (pixels). Using well-known algorithms, source pixel data (e.g., data representing an image) is formatted by an associated control circuit and loaded into the pixel array using any of a number of well-known addressing schemes, typically addressing all pixels in parallel.

One type of SLM, referred to herein as a micro-mirror array, is a monolithic integrated circuit with an array of movable micro-mirrors fabricated over the requisite address, control and drive circuitry. Micro-mirrors are normally bistable, switching between two stable positions in response to digital control signals. Each mirror in a given array forms one pixel, wherein a source of light directed upon the mirror array will be reflected in one of two directions depending upon the selected one of the two stable mirror positions. In an "on" mirror position, incident light to a given mirror is reflected to a projector lens and focused on a display screen or a photosensitive element of a printer; in an "off" mirror position, light directed on the mirror is deflected to a light absorber outside of the numerical aperture of the projecting lens.

When the micro-mirror array is used in a display, the projector lens magnifies the modulated light from the pixel mirrors onto a display screen. Gray scale of the pixels forming the image is achieved by pulse-width modulation, as described in U.S. Pat. No. 5,278,652, entitled "DMD Architecture and Timing for Use in a Pulse-Width Modulated Display System," which is incorporated herein by reference.

For more detailed discussions of conventional micro-mirror devices, see the following U.S. patents, each of which is incorporated herein by reference:

1. U.S. Pat. No. 5,535,047 to Hornbeck, entitled "Active Yoke Hidden Hinge Digital Micro-mirror Device;
2. U.S. Pat. No. 5,079,544 to DeMond, et al, entitled "Standard Independent Digitized Video System"; and
3. U.S. Pat. No. 5,105,369 to Nelson, entitled "Printing System Exposure Module Alignment Method and Apparatus of Manufacture."

The evolution and variations of the micro-mirror devices can be appreciated through a reading of several issued patents. The "first generation" of micro-mirror based spatial light modulators was implemented with analog control of electrostatically driven mirrors using parallel plate configurations. That is, an electrostatic force was created between the mirror and the underlying address electrode to induce deflection thereof. The deflection of these mirrors can be variable and operate in the analog mode, and may comprise a leaf-spring or cantilevered beam, as disclosed in the following U.S. patents, each of which is incorporated herein by reference:

1. U.S. Pat. No. 4,662,746 to Hornbeck, entitled "Spatial Light Modulator and Method";
2. U.S. Pat. No. 4,710,732 to Hornbeck, entitled "Spatial Light Modulator and Method";
3. U.S. Pat. No. 4,956,619 to Hornbeck, entitled "Spatial Light Modulator"; and
4. U.S. Pat. No. 5,172,262 to Hornbeck, entitled "Spatial Light Modulator and Method."

This first generation micro-mirror can also be embodied as a digital or bistable device. The mirror is supported by a torsion hinge and axially rotated one of two directions about 10 degrees, until the mirror tip lands upon a mechanical stop, or "landing pad." Such an embodiment is disclosed in U.S. Pat. No. 5,061,049 to Hornbeck entitled "Spatial Light Modulator and Method," which is incorporated herein by reference. To limit the static friction (stiction) force between the mirror tips and the landing pads, the landing pads may be passivated by an oriented monolayer formed upon the landing pad. This monolayer decreases the stiction forces and prevents the mirror from sticking to the electrode. This technique is disclosed in U.S. Pat. No. 5,331,454 to Hornbeck, entitled "Low Reset Voltage Process for DMD," and also incorporated herein by reference.

A "second generation" of micro-mirror device is embodied in U.S. Pat. No. 5,083,857 entitled "Multi-Level Deformable Mirror Device," and U.S. Pat. No. 5,583,688 entitled "Multi-level Digital Micro-mirror Device," both of which are incorporated herein by reference. In this second generation device, the mirror is elevated above a "yoke," this yoke being suspended over the addressing circuitry by a pair of torsion hinges. An electrostatic force is generated between the yoke and electrodes, again with parallel plate actuator configuration. When rotated, it is the yoke that comes into contact with a landing electrode: the mirror tips never come into contact with any structure. The shorter moment arm of the yoke, being about 50% of the mirror, decreases stictional torque and allows lower electrostatic torque to switch the mirror assembly. Applying resonant reset pulses to the mirror to help free the pivoting structure from the landing electrode is disclosed in U.S. Pat. No. 5,096,279, entitled "Spatial Light Modulator and Method," and U.S. Pat. No. 5,233,456 entitled "Resonant Mirror and Method of Manufacture," both of which are incorporated herein by reference. However, some of the address torque generated between the yoke and the address electrode is sacrificed compared to the first generation devices because the yoke slightly diminishes the surface area of the address electrode.

Despite the aforementioned advances, parallel plate electrostatic devices generate very low deflection torque and require very low stiffness suspension hinges. Consequently, conventional micro-mirrors are relatively fragile and difficult to fabricate, and may therefore suffer from low yield and increased manufacturing expense. Also, while various process techniques have been developed to ameliorate the stiction problem, the repeated physical contact between the moveable and fixed surfaces still reduces device reliability and lifetime. There is therefore a need for methods and actuators that significantly increase driving torque, eliminate or reduce effects of stiction, improve production yield, reduce micro-mirror production cost, and increase micro-mirror reliability.

High resolution SLMs have a considerable number of pixels, and thus require considerable drive and control electronics. For example, a MEMS based SLM for use in High Definition Television (HDTV) projection systems may have one and a half to four million pixels, each requiring at least two drive contacts and one common electrode contact. Integrated drive and control circuitry would thus require about four to twelve million contacts to the pixel array. Some SLMs may require even more contacts, e.g. to provide feedback, further complicating the process of integrating the drive electronics.

There exists a need in the art for integrated MEMS/ electronic systems, and consequently for means of providing compatible MEMS and CMOS processes and for reliably providing myriad contacts between MEMS devices and the associated drive and control circuitry.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1:
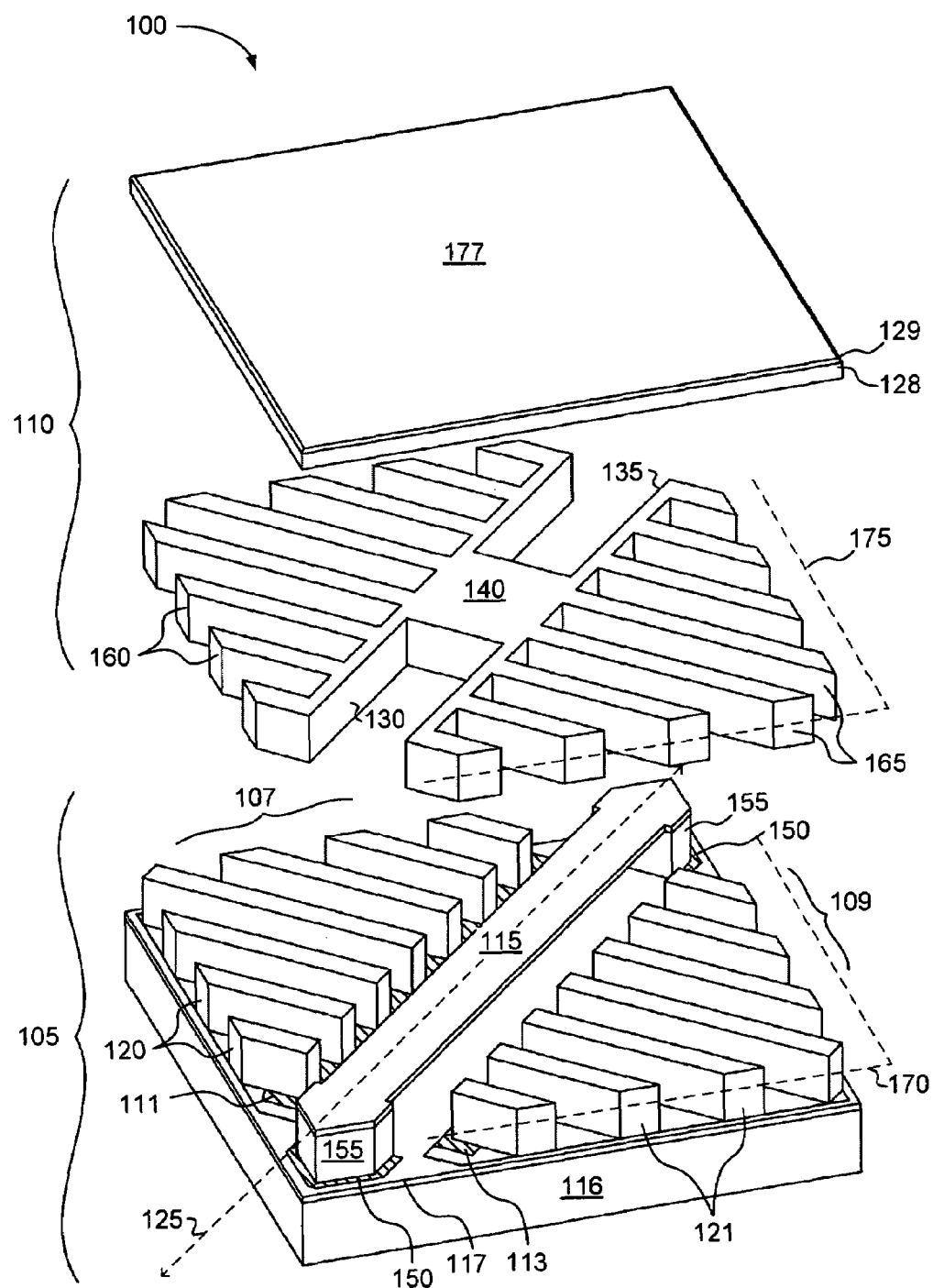
FIG. 1 depicts a Micro-Electro-Mechanical Systems (MEMS) actuator 100 in accordance with one embodiment.

FIG. 1 depicts a Micro-Electro-Mechanical Systems (MEMS) actuator 100 in accordance with one embodiment. Actuator 100 employs hidden comb electrostatic actuators that produce much greater torque than the parallel-plate electrostatic actuators of the above-referenced Hornbeck patents. Greater torque facilitates the use of stiffer, less fragile hinge structures. Also important, comb actuators adapted for use with the invention have a more stable response curve than parallel plate actuators in the direction of deflection, and consequently afford greater position control. These and other advantages, and the means of achieving them, are detailed below.

Actuator 100 is broadly divided into a fixed (stationary) portion 105 and a movable portion 110, the two of which are interconnected via a torsional hinge 115. Fixed portion 105 includes a pair of fixed combs 107 and 109 disposed over a respective pair of addressing electrodes 111 and 113, which are in turn disposed over a substrate 116 and through an insulating layer 117.

Substrate 116 is, in an embodiment formed using a monolithic fabrication process, a wafer with an application-specific integrated circuit (ASIC) that incorporates the control, driving, and addressing electronics for actuator 100. Actuator 100 is formed on top of substrate 116, e.g. in the manner described below in connection with FIGS. 4A-4Y. The electronics can be implemented using any of a number of conventional device fabrication processes, including those commonly used to form Complementary Metal Oxide Semiconductor (CMOS) circuits. These circuits are preferably formed using processes detailed below in connection with FIGS. 7A-7E. In embodiments formed using hybrid fabrication processes, actuators 100 and the ASIC electronics are formed separately, on different substrates, and later bonded together using any of a number of conventional bonding techniques, such as those commonly employed in "flip-chip" technologies. In such embodiments, the substrate upon which actuator 100 is formed, the so-called "handle" substrate, can be on top of actuator 100 from the perspective of FIG. 1A during fabrication and later removed after bonding to an ASIC wafer. The handle substrate can be e.g. silicon, glass, or some other sacrificial substrate.

Each of fixed-combs 107 and 109 includes a respective plurality of teeth 120 and 121 that extend in the direction perpendicular to a fulcrum axis 125 defined along hinge 115. Fixed combs 107 and 109 are electrically isolated from one another so that disparate voltage levels can be applied thereto. Fixed combs 120 and 121 are all of a conductive material, such as highly doped polysilicon (poly-Si) or polysilicon-germanium (poly-Si—Ge) or metals or metal alloys, and are electrically connected to respective electrodes 111 and 113. Alternatively, the combs can be formed with non-conducting materials and overcoated with conductive materials such as metals.

Movable portion 110 includes a pair of movable combs 130 and 135 connected to hinge 115 via a bridge 140. Moveable combs 130 and 135, bridge 140, and hinge 115 are all of a conductive material, such as doped poly-Si or poly-Si—Ge, metals, or metal alloys, and are electrically connected to a pair of contact pads 150 via a pair of conductive hinge posts 155. Teeth 160 and 165 of respective movable combs 130 and 135 are interdigitated from a perspective normal to a first plane 170 extending through the fixed combs and a second plane 175 extending through the movable combs.

An actuated member 177 covers the top surface of movable combs 130 and 135 and bridge 140. It is formed either by a single metallic layer such as gold or aluminum or by two layers 128 and 129. Layer 128 can be made from poly-Si or poly-Si—Ge, while layer 129 can be made from highly reflective metal such as gold or aluminum or a metal alloy. In a typical embodiment, actuated member 177 is one of an array of mirrors used to form a spatial light modulator. Top portion 110 is tilted in one direction along fulcrum axis 125 (e.g., a counterclockwise direction) by holding movable combs 130 and 135 at ground potential while adjusting the voltage level applied to teeth 120 of fixed comb 107 to a level between e.g. zero and three Volts or zero and five Volts. Applying a potential difference between combs 130 and 107 creates an electrostatic attraction that draws combs 130 and 107 together. With sufficient applied voltage, the teeth of the respective combs 130 and 107 interdigitate and structure 110 rotates in the first direction. To tilt top portion 110 in the opposite (e.g., clockwise) direction, movable combs 130 and 135 are held again at ground potential while adjusting the voltage level applied to teeth 121 of fixed comb 109. Movable combs 130 and 135 can both be moved, to a small extent, in a direction normal to planes 170 and 175, by applying the same potential to both fixed combs 107 and 109, thereby causing hinge 115 to flex toward substrate 116, resulting in translational displacement.

Figure 2:
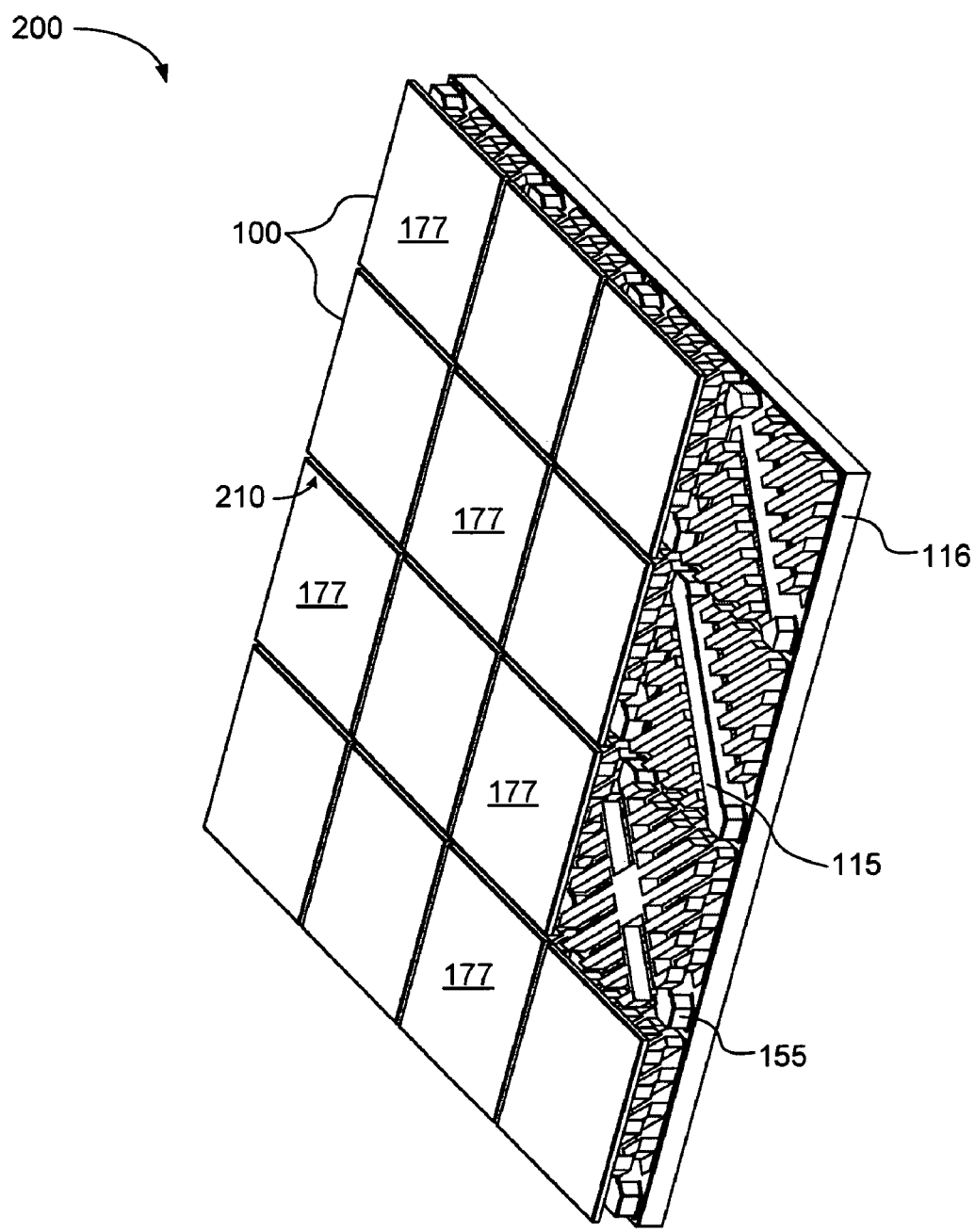
FIG. 2 depicts a mirror array 200 made up of sixteen (4×4) actuators 100 formed integrally on a single substrate 116.

FIG. 2 depicts a mirror array 200 made up of sixteen (4×4) actuators 100 formed integrally on a single substrate 116. Because actuated members 177 obscure the underlying actuators when viewed from a perspective normal to the mirror surfaces (the top surfaces of actuated members 177), three of actuated members 177 are removed to expose various underlying structures.

In array 200, the mirror surfaces are the active areas, and should be closely spaced. The mirror surfaces obscure the hidden comb actuators, allowing the combined active mirror surfaces to account for more than 85% of the total array surface, where the total array surface is the active mirror surface combined with interstitial spaces 210. In some embodiments, the active mirror surfaces account for more than 90% of the total array surface. Though not shown, the mirror surfaces may be of other shapes, preferably those that can be positioned close to one another without excessive interstitial spacing. Possible shapes include rectangles, hexagons, and triangles. Also important, actuator 100 and other embodiments of the invention do not include the conspicuous hole in the center of conventional micro-mirror arrays of the type described in the above-referenced U.S. Pat. No. 5,535,047. The elimination of these holes advantageously increases the active array surface. Also important, the mechanical structures of MEMS actuator 100 are of poly-Si or poly-Si—Ge, and are thus far tougher than the aluminum mechanical structures of the prior art. The fracture strengths or critical stresses of poly-Si and poly-Si—Ge are typically over one GigaPascal (1 GPa), whereas aluminum alloys typically exhibit fracture strengths between about 0.3 and 0.5 GPa. The improved material strength of the mirror components in accordance with the embodiments described herein produces more robust mirror structures, improves device yield, reduces fatigue, and increases lifetimes.

Figure 3A:
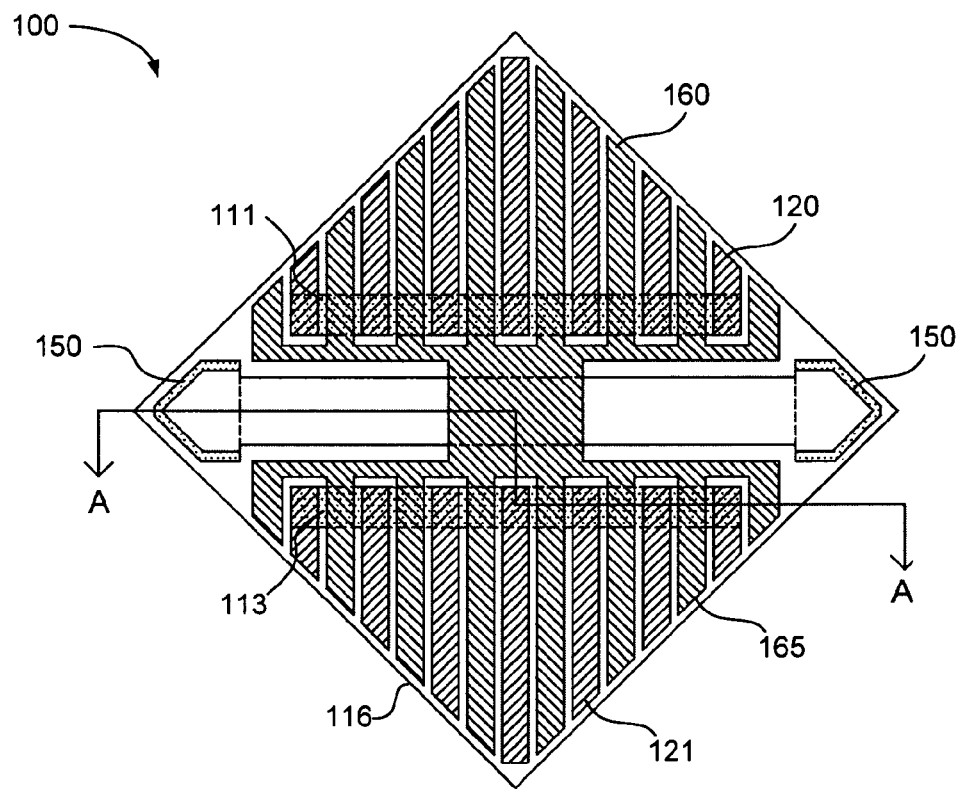
FIG. 3A is a top view of actuator 100 of FIG. 1.
Figure 3B:
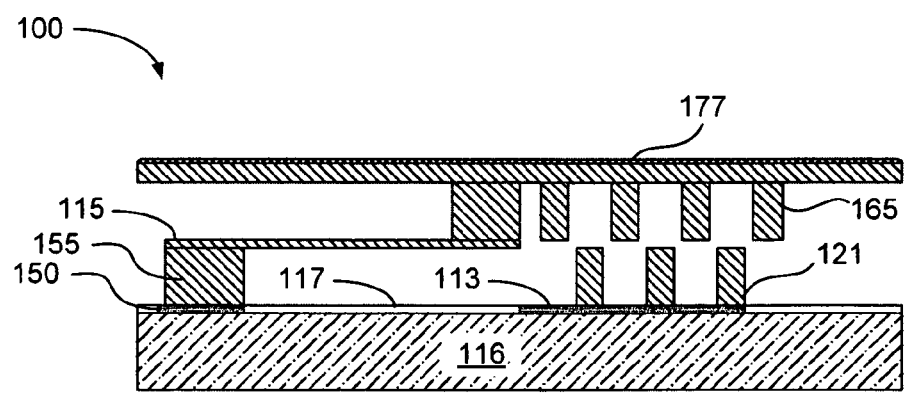
FIG. 3B is a cross-sectional diagram of actuator 100 taken along line A-A' of FIG. 3A.

FIG. 3A is a top view of actuator 100 of FIG. 1: actuated member 177 is removed to show the spatial relationship between the movable and fixed combs. FIG. 3B is a cross-sectional diagram of actuator 100 taken along line A-A' of FIG. 3A.

The comb actuators employed in embodiments of the invention offer significant advantages over parallel-plate actuators. For example, the greater torque provided by the comb actuator means that, for comparable deflection angles, comb actuators can employ suspensions with much higher stiffness as compared with parallel-plate actuators or lower driving voltages at the same hinge stiffnesses. Consequently, fabrication yield, resonance frequencies, response times, insensitivity to vibration and shock, and device reliability are significantly improved. Moreover, the stiffer hinges can be made from materials that resist the fatigue due to repeated flexing, which may improve the useable life of actuators in accordance with the invention. Many variations in hinge dimension and shape (e.g., serpentine) can be used to reduce or otherwise alter hinge stiffness, if desired.

Comb actuator 100 does not require mechanical stops because the deflection angle is a stable function of the applied voltage and the spring constant of hinge 115, particularly when the deflection angle is in an area of the response curve at which deflection angle is only weakly affected by small variations in applied voltage. The ability to operate without mechanical stops is a significant advantage over conventional micro-mirrors that use landing pads to position mirrors in "on" and "off" states and that seek to ameliorate the stiction problem using e.g. landing pads coated with special materials that reduce adhesion, spring arrangements and driving waveforms.

Landing pads, such as those passivated by an oriented monolayer, can be included in embodiments of the invention, but are not required. Landing pads are not necessary because the comb actuator has a natural stopping point that depends upon the applied voltage. However, if landing pads are desired, the higher torque of the comb actuator advantageously provides greater torque for overcoming stiction forces.

For bistable operation, the applied voltage V can be selected to produce just two stable states, e.g. such that deflection angle θ at which the driving electrostatic torque equals the restoring torque of hinge 115 corresponds to a desired "on" or "off" state. The number of operational states need not be defined by stops, but can instead be defined using any number of allowed signal combinations applied between the fixed and movable combs. For example, actuator 100 can have two operational states by limiting the number of signal combinations to the two that produce the depicted "on" and "off" states. In general, actuator 100 can employ N signal combinations to produce N states.

Returning to FIG. 1, hinge 115 extends diagonally across actuator 100, but might be oriented differently, for example along one edge or across the middle of actuator 100 in parallel with an edge. However, extending hinge 115 diagonally enables a longer, and therefore more flexible hinge, and supports the use of teeth of varying length. Configured as shown, the longer teeth begin to interdigitate before the shorter teeth as voltage is applied, with more teeth coming into play as the torque required to twist hinge 115 increases.

Torque generated between a single moving tooth and two corresponding fixed teeth has three overlapping regions. In the first region, torque increases relatively slowly with applied voltage until the deflection angle at which the movable tooth is lightly interdigitated with corresponding fixed teeth. The torque increases rapidly in the second region with significant interdigitation. In the third region, the torque asymptotically saturates as the interdigitation is completed. In rotational comb actuators that employ teeth of different lengths, these three regions of torque generation occur at different voltages for teeth of different lengths, so the overall actuator responds somewhat linearly to the applied driving voltage. The effect is to produce a more linear actuator response than a similar rotational comb actuator in which all teeth are of similar length. Also desirable, comb actuators with teeth of various lengths exhibit more damping than otherwise similar actuators in which all the teeth are of equal length.

Figure 4A:
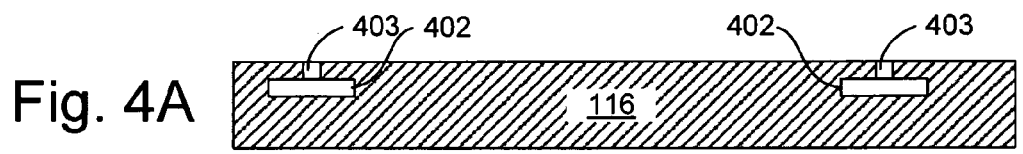
FIGS. 4A through 4Y depict a process of fabricating an actuator similar to actuator 100 of FIGS. 1, 2, 3A, and 3B.
Figure 4B:
Figure 4C:
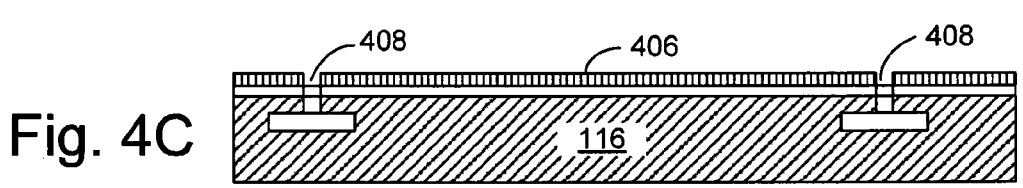
Figure 4D:
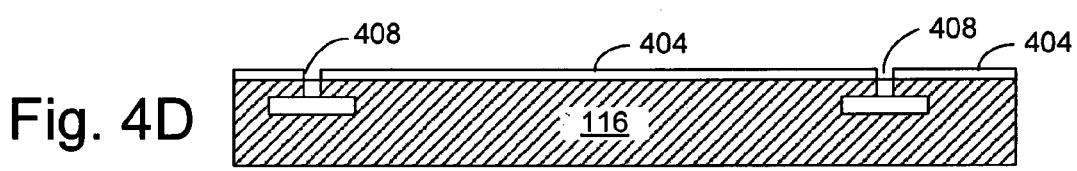
Figure 4E:
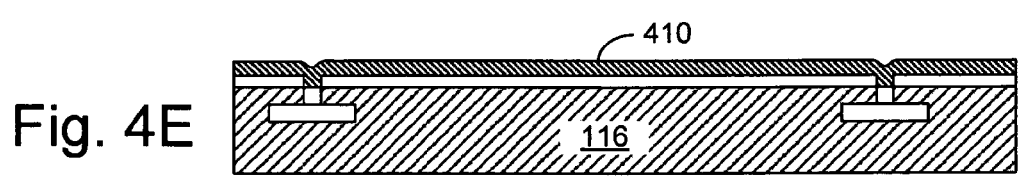
Figure 4F:
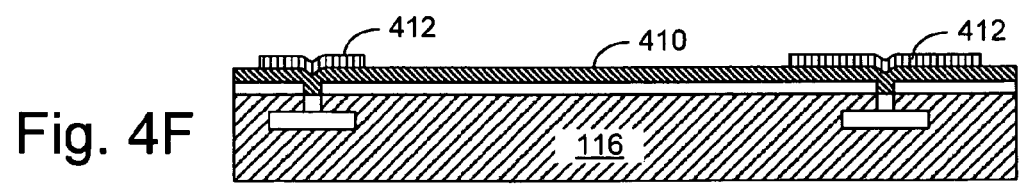
Figure 4G:
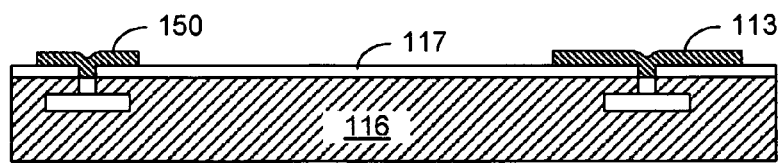
Figure 4H:
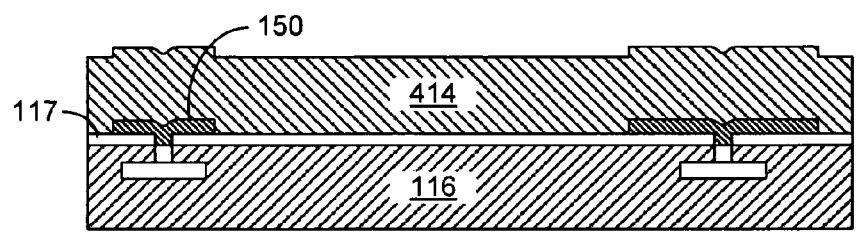
Figure 4I:
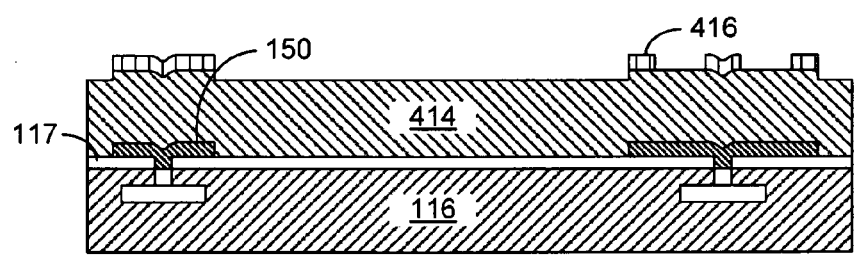
Figure 4J:
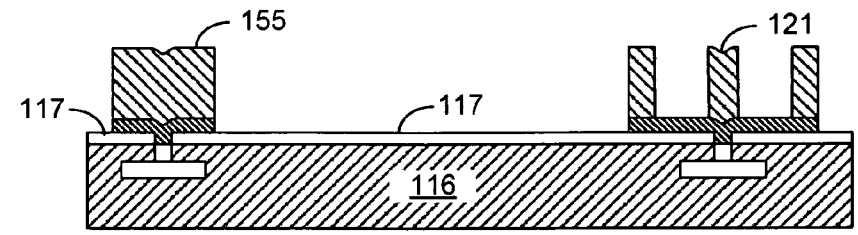
Figure 4K:
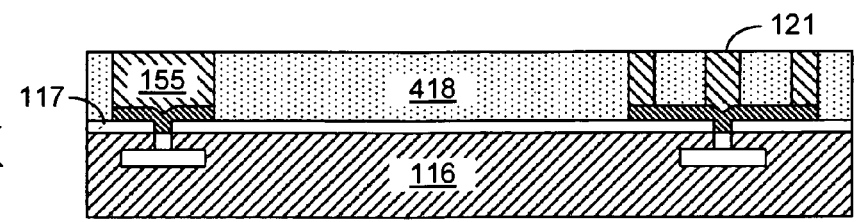
Figure 4L:
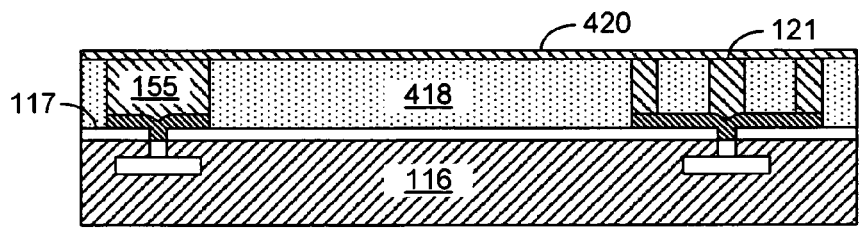
Figure 4M:
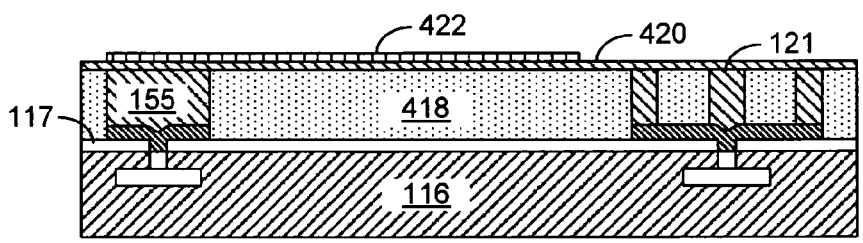
Figure 4N:
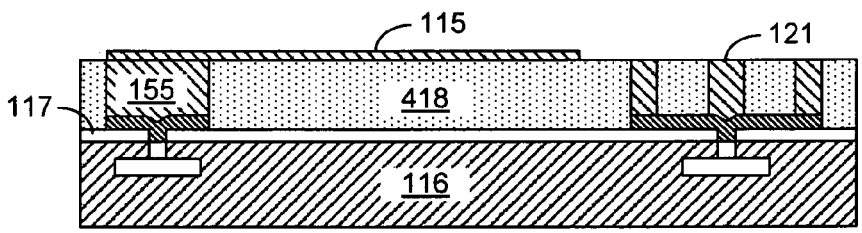
Figure 4O:
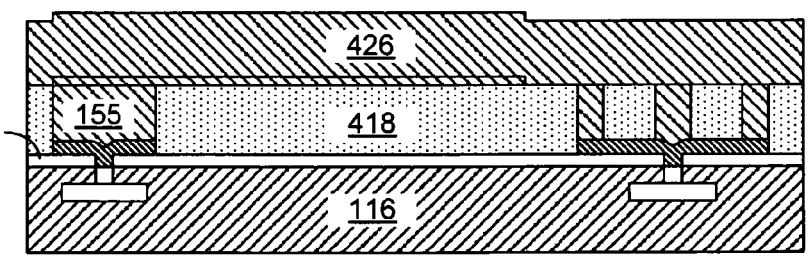
Figure 4P:
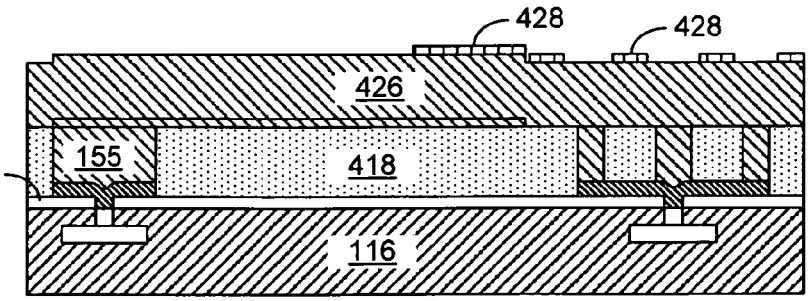
Figure 4Q:
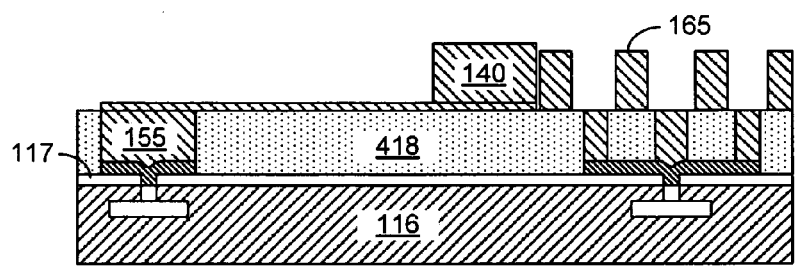
Figure 4R:
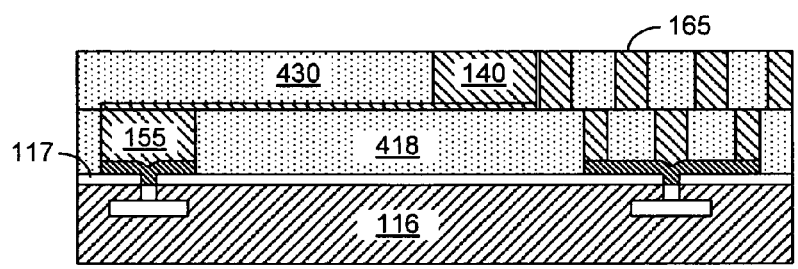
Figure 4S:
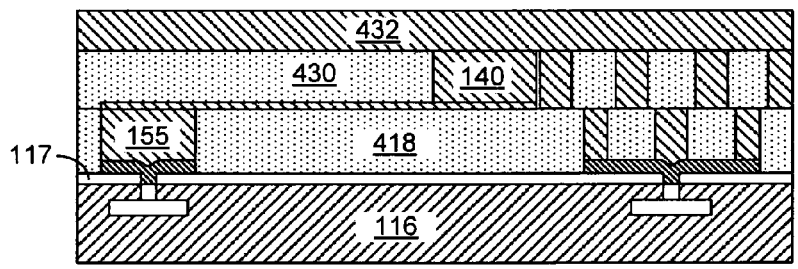
Figure 4T:
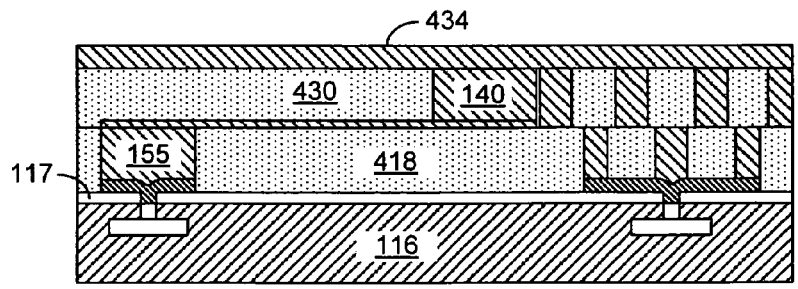
Figure 4U:
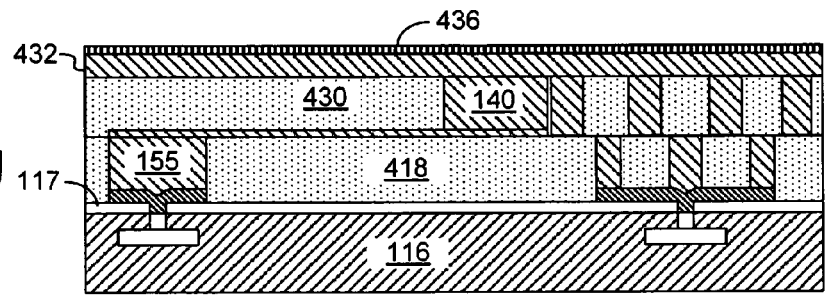
Figure 4V:
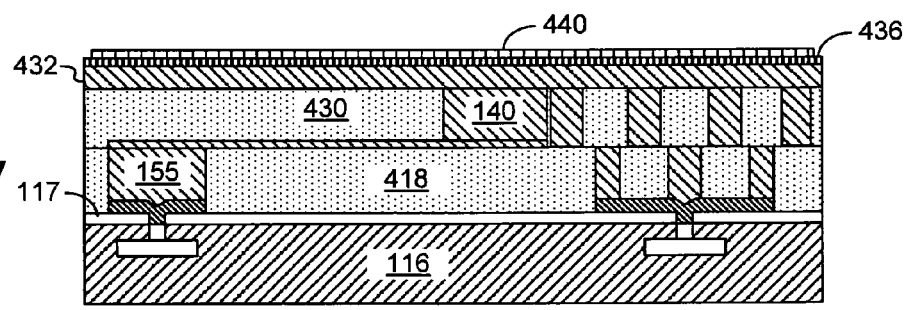
Figure 4W:
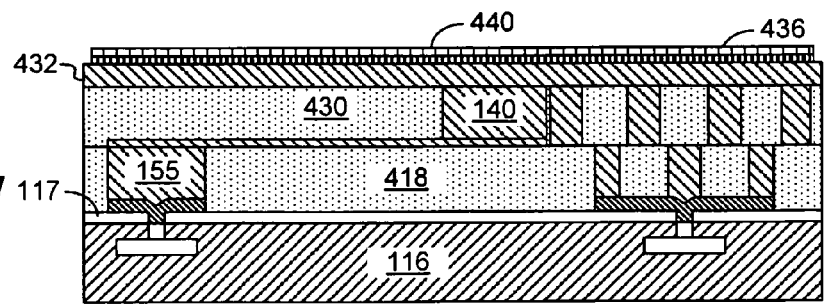
Figure 4X:
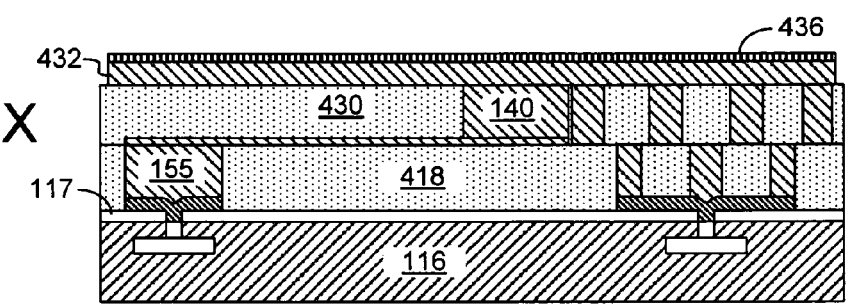
Figure 4Y:
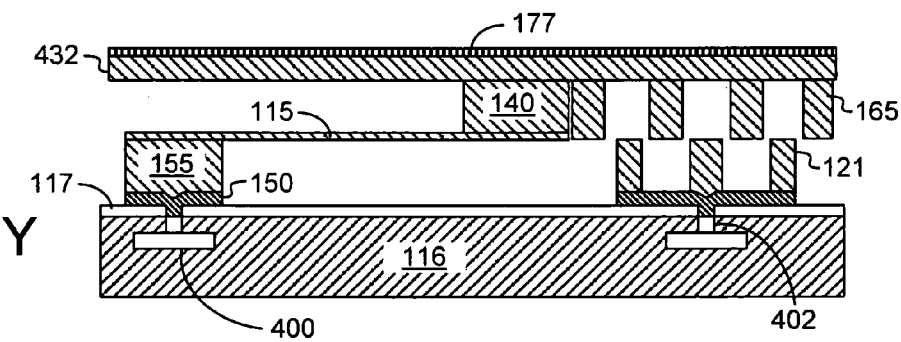

FIGS. 4A through 4Y depict a process of fabricating an actuator similar to actuator 100 of FIGS. 1, 2, 3A, and 3B, like-numbered elements being the same or similar; this process sequence develops along line A-A' of FIG. 3A, culminating with a cross section similar to that of FIG. 3B, like-numbered element being the same or similar.

First, driving and addressing electronics is fabricated as described below, however, MEMS part of fabrication will be outlined next. The MEMS part of the process begins (FIG. 4A) with substrate 116, an ASIC in this example. Substrate 116 includes a number of conductive traces 402, shown as rectangles, connected to the requisite drive electronics (shown below) within substrate 116. Conductive vias 403 extend up from traces 402 to the surface of substrate 116.

As depicted in FIG. 4B, the exposed surface of substrate 116 is coated with a silicon nitride layer, with or without an underlying silicon dioxide layer, to produce an insulating layer 404. The resulting structure is then masked using a photoresist layer 406, which is patterned to define contact areas 408 (FIG. 4C) within which electrodes 111, 113, and 150 will make contact to vias 403. (The cross-section of FIGS. 4A-4Y does not intersect electrode 111). Insulating single or double layer 404 is then etched to expose contact areas 408, leaving the structure of FIG. 4D.

Next, a layer of poly-Si or metal 410 is deposited using a conventional process, resulting in the structure of FIG. 4E. Layer 410 is then patterned with photoresist 412 (FIG. 4F) to define electrodes 111, 113, and 150. The exposed portions of layer 410 are then etched and photoresist mask 412 is removed, leaving electrodes 111 (not shown), 113, and 150 (FIG. 4G). Layer 410 makes contact to underlying vias 403 to communicate with underlying traces 402. The patterned layer 404 becomes insulating layer 117, which acts as an etch stop when removing sacrificial material at later stages of fabrication.

The process sequence depicted in FIGS. 4H through 4K defines fixed combs 107 and 109 and hinge posts 155. Referring first to FIG. 4H, a layer of structural material such as highly doped poly-Si 414 is deposited to an appropriate thickness for the height (i.e., normal to plane 170 of FIG. 1) of fixed combs 107 and 109, two microns in this example. A photoresist mask 416 (FIG. 4I) then defines fixed combs 107 and 109, hinge post 155, and possibly an alignment pattern (not shown) for alignment of the later-formed movable teeth.

Layer 414 and the other conductive layers can be formed of structural materials other than poly-Si. For example, poly-Si—Ge alloys can be deposited and annealed at lower temperatures, potentially allowing for simpler and less expensive ASIC metallization processes. Another alternative is to use metal or metal alloys instead of poly-Si for some or all structural layers, also allowing lower temperature processing; however, degradation of mechanical properties of a hinge would occur due to the sensitivity of metals and metal alloys to mechanical fatigue compared with that of poly-Si or single-crystal silicon.

A silicon deep reactive-ion etch (RIE) removes unmasked portions of poly-Si layer 414, leaving walls that can be close to normal with respect to the surface of film 414 and with a good aspect ratio. The photoresist mask 416 is then removed, leaving conductive posts 155 and the fixed comb teeth 121 shown in the cross-section of FIG. 4J. The whole wafer is then coated with a sacrificial material 418, such as silicon dioxide or germanium. For subsequent higher temperature processing, silicon dioxide or another inorganic dielectric is used, while for low temperature processing, photoresist can be used as a sacrificial material. The resulting structure is then planarized, e.g. by chemical mechanical polishing, to produce the cross section of FIG. 4K. For chemical mechanical polishing techniques commonly applied to poly-Si and silicon dioxide, see for e.g. A. A. Yaseen, et al, J. Electrochem. Soc. 144, 237-242, 1997, which is incorporated herein by reference.

The planarization process removes the topography from the oxide, poly-Si, etc. A suitable method of oxide polishing employs a slurry that consists of a silica-based colloidal suspension in a dilute alkaline solution (a pH of 10-11). The alkaline process hydrolyzes the oxide surface, weakening silicon-oxide bonds. This chemical erosion combines with mechanical erosion to selectively remove relatively high surface features.

The process sequence of FIGS. 4H through 4J is repeated with a different mask sequence to form hinge 115. (In other embodiments, the bottom portions of movable combs 130 and 135, the top portions of fixed combs 107 and 109, or both, are formed at the same time.)

First, as depicted in FIG. 4L, a second structural layer of highly doped poly-Si 420 is deposited to a depth appropriate for the thickness of hinge 115, 0.1 microns in this example. Hinge 115, bridge 140, and, if desired, the bottom 0.1 microns of movable combs 130 and 135, the top 0.1 microns of fixed combs 107 and 109, or both, are patterned on layer 420 with a photoresist mask 422 (FIG. 4M). The exposed poly-Si is then etched away, using an RIE, before removing photoresist mask 422. A thin layer of silicon dioxide is deposited over this structure, patterned with photoresist and etched so that only oxide in the region between hinge 115 and bridge 140 is removed. The remaining oxide will serve as an etch stop in the subsequent etching, in particular during step Q below. The resulting structure is depicted in FIG. 4N, in which the cross-section includes a portion of hinge 115.

Next, the process sequence of FIGS. 4H through 4K is repeated with different masks to form movable combs 130 and 135 and bridge 140. First, as depicted in FIG. 4O, a third structural layer of highly doped poly-Si 426 is deposited to a depth appropriate for the thickness of movable combs 130 and 135, two microns in this example. Windows (not shown) are then opened in layer 426 to expose the alignment features in layer 414 (the only features of layer 414 visible in FIG. 4O are post 155 and teeth 120 and 121). Movable combs 130 and 135 and bridge 140 are patterned on layer 426 with a photoresist mask 428 (FIG. 4P).

The exposed poly-Si is then etched away, using an RIE, before removing the photoresist mask. The silicon oxide layer covering the hinge serves as an etch stop during this RIE step to prevent etching away or excessive thinning of the hinge. The resulting structure, including portions of bridge 140 and movable teeth 160 and 165, is depicted in FIG. 4Q. The structure is then coated with a sacrificial material 430 and planarized (FIG. 4R) in the manner discussed above in connection with FIG. 4K.

FIG. 4S depicts the first step in forming actuated member 177. Next, a fourth structural material, highly doped poly-Si layer 432 is deposited, to a depth of approximately 0.3-0.5 microns in this embodiment. Optionally, layer 432 is smoothed to a mirror finish using chemical mechanical polishing techniques commonly applied to poly-Si (see above). In one embodiment, this polishing step leaves a surface 434 (FIG. 4T) having an approximate root mean squared roughness of less then 0.5 nm. The resulting polished poly-Si layer 432 is slightly thinned (by approximately 10% of the initial thickness). If the initial surface finish of layer 432 is adequate, the polishing step can be skipped. A reflective layer 436 is then formed over layer 432 (FIG. 4U). Layer 436 can be a single or compound layer, and is formed in one embodiment by depositing first a chromium adhesion layer and then a reflective gold or aluminum layer.

The sequence of FIGS. 4A through 4U depicts the formation of a single actuator 100. However, arrays of such actuators will normally be formed together, as discussed above in connection with FIG. 2, for example. FIGS. 4V through 4X and the associated discussion illustrate how individual mirrors are separated in accordance with a multiple-mirror embodiment.

First, a photoresist layer 440, formed over the total array surface, is patterned to define the mirror surfaces (FIG. 4V). The exposed portions of reflective layer 436 are then removed, leaving metal layer 436 patterned as an array of mirrors (FIG. 4W). What remains of metal layer 436 then masks the underlying poly-Si layer 432 during a dry RIE process that removes portions of layer 432 to separate the actuated members of the array. After RIE, photoresist layer 440 is removed (FIG. 4X). Finally, a silicon-dioxide dielectric etch, using wet or vapor hydrofluoric acid, for example, removes the remaining material of sacrificial layers 430 and 418; nitride insulating layer 117 acts as an etch stop. The wet structure is then carefully rinsed and dried. A suitable drying process is described in "Supercritical Carbon Dioxide Solvent Extraction From Surface-Micromachined Micromechanical Structures," by C. W. Dyck, et al. (SPIE Micromachining and Microfabrication, October 1996), which is incorporated herein by reference. The resulting structure, depicted in FIG. 4Y, is similar to that of FIG. 3B, like-numbered elements being the same or similar.

Here, monolithic fabrication of actuators built directly on top of driving electronics is used. When poly-Si is used as a structural material, annealing at temperatures around 1000 degrees Celsius is performed after each poly-Si deposition. The interconnects provided for the metallization in addressing and driving electronics are of materials, such as tungsten, that exhibit high alloying and melting temperatures. When poly-Si—Ge alloys are used for structural members of the actuators, processing temperatures are lower, e.g. below 450 degrees Celsius. When metals and metal alloys are used as structural materials, even lower processing temperatures (e.g., down to room temperature) are possible. With poly-Si—Ge, metals, or metal alloys as structural materials, conventional metallization of CMOS and vias with aluminum or copper is possible.

Drive Circuitry

Mirrors 100 collectively form an array, as depicted in FIG. 2. Each mirror represents a pair of plates with each opposing pair of comb electrodes forming a capacitor that exhibits a varying amount of capacitance based on the spacing of the respective fixed and movable comb teeth. Applying a voltage across one or both of the capacitors represented by a given mirror produces an attractive force between the opposing combs, and consequently deflects the hinge to alter the angle of the respective mirror. Many forms of drive and control circuitry can be used to apply appropriate control voltages to mirrors 100; the present disclosure details three approaches, but many other approaches will be evident to those of skill in the art.

Figure 5:
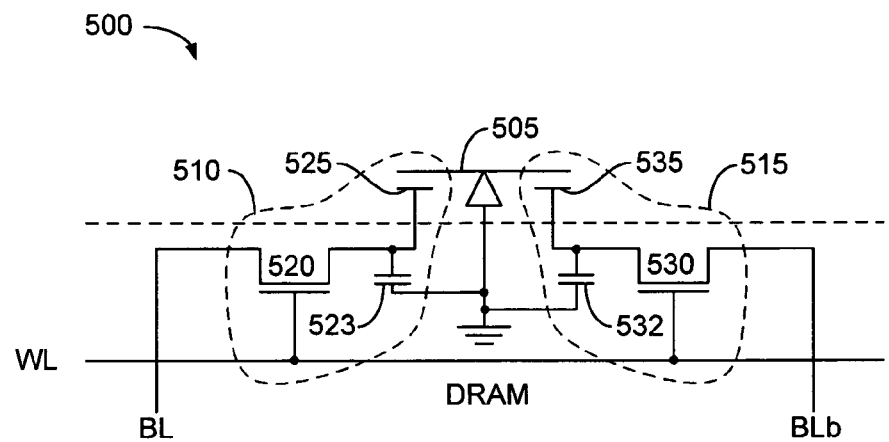
FIG. 5 schematically depicts an integrated system 500 that includes an actuated mirror 505 instantiated as part of a pair of complementary dynamic memory cells 510 and 515.

FIG. 5 schematically depicts an integrated system 500 that includes an actuated mirror 505 instantiated as part of a pair of complementary dynamic memory cells 510 and 515. Memory cell 510 includes a transistor 520 having a first current-handling terminal connected to a bitline BL, a second current-handling terminal connected to a storage capacitor 523 and a stationary electrode 525 (e.g. teeth 120 in FIG. 1), and a control terminal connected to a wordline WL. Similarly, memory cell 515 includes a transistor 530 having a first current-handling terminal connected to a bitline BLb, the complement to bitline BL, a second current-handling terminal connected to a storage capacitor 532 and a second stationary electrode 535, and a control terminal connected to wordline WL. Mirror 505 is of a conductive material and is connected to ground potential. Each stationary electrode 525 and 535 thus combines with mirror 505 to capacitively couple the respective second current-handling terminals of transistors 520 and 530 to ground. The capacitance between the second current-handling terminal of each transistor and ground stores charge in the manner of a conventional Dynamic Random Access Memory (DRAM) cell.

An array of mirrors 505 and associated circuitry can be considered a memory array with variable capacitors. Such memories can be read electronically in the manner of other types of memory cells or can be "read" optically, by viewing light modulated with the array. Methods and circuits for reading from and writing to memory cells are very well known, and can be applied to system 500 to control the angle of mirror 505. Reading functionality is, however, optional and only writing capability is required.

Mirror 505 can be tilted one of two directions by applying an appropriate bias voltage to the stationary electrodes. In one embodiment, for example, mirror 505 is tilted counter-clockwise by precharging bitlines BL and BLb to five and zero volts, respectively, and asserting wordline signal WL to turn on transistors 520 and 530. The resulting voltage difference between electrodes 525 and 505 attracts the left side of mirror 505, causing mirror 505 to rotate counter-clockwise on the pivotal axis (illustrated here as the pinnacle of a triangle). Wordline signal WL is then deasserted, in which case mirror 505 will return to equilibrium as charge leaks away from the second current-handling terminal of transistor 520. Mirror 505 is tilted in the opposite direction by precharging bitlines BL and BLb to zero and five volts, respectively, and asserting wordline signal WL. The resulting voltage difference between electrodes 535 and 505 attracts the right side of mirror 505, causing mirror 505 to rotate in the clockwise direction. Wordline signal WL is then deasserted, in which case mirror 505 will return to equilibrium as charge leaks away from the second current-handling terminal of transistor 530. Due to the leakage, care must be taken to write to each mirror/memory-cell often enough to prevent a change in the perceived mirror state between accesses.

Some embodiments support read capability to facilitate test and repair, and hence to improved yield. The requisite read circuitry adds complexity, however, and is therefore omitted in other embodiments. Some embodiments facilitate testing with the inclusion of a dual-port. DRAM (with an N-bit parallel input and a 1-bit serial output, wherein N is e.g. 8) as the driver for each mirror. The serial output of the DRAM is connected to stationary electrodes 535 and 525. Such embodiments permit the storage of an N-bit value for modulating each mirror to produce desired grayscale intensity modulation. Color is generated in some such embodiments by loading red, green, and blue grayscale values successively, serially or in parallel, into the N-bit memory.

Figures 6A, 6B:
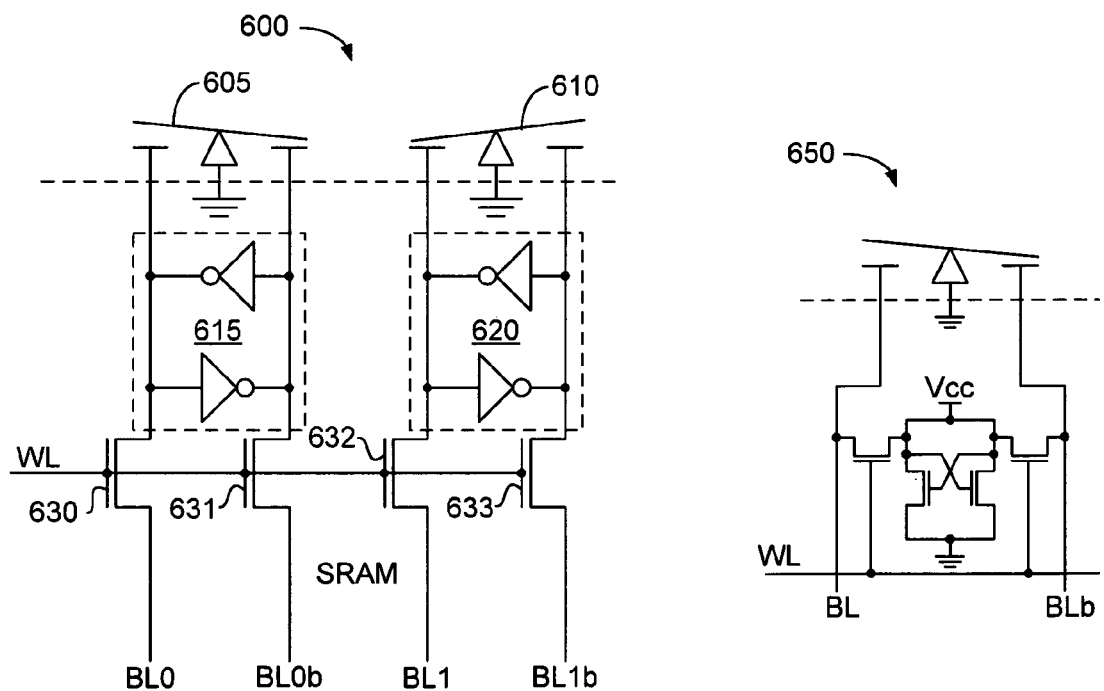
FIG. 6A schematically depicts an integrated system 600 that includes a pair of actuated mirrors 605 and 610 integrated with static memory cells and drive circuitry.
FIG. 6B depicts an integrated system 600 in accordance with another embodiment.

FIG. 6A schematically depicts an integrated system 600 that includes a pair of actuated mirrors 605 and 610 integrated with static memory cells and drive circuitry. Mirrors 605 and 610 are formed with underlying drive and control circuitry, a portion of which is depicted as static memory cells 615 and 620 and a number of access transistors 630, 631, 632, and 633. From the perspective of the drive electronics, system 600 is simply a static memory.

Mirror 605 can be tilted clockwise, as shown, by pre-charging bitline BL0 to zero volts and bitline BL0b to five volts before turning on transistor 630 and 631 by asserting a wordline signal on wordline WL. Turning on transistors 630 and 631 overrides any level stored by the cross-coupled inverters of memory cell 615 and applies five volts to the rightmost stationary electrode associated with mirror 605. Memory cell 615 retains the stored state when transistors 630 and 631 are disabled.

FIG. 6B depicts an integrated system 650 in accordance with another embodiment. System 650 is similar to system 600 of FIG. 6A, but includes a cross coupled latch realized with only NMOS transistors. A detailed discussion of system 650 is omitted for brevity.

Conventional CMOS circuits include metal interconnect structures that will melt and diffuse at temperatures required to anneal poly-Si MEMS features. Aluminum and silicon begin to alloy at about 500 degrees Celsius, for example, so that CMOS circuits with aluminum interconnect structures may be incompatible with poly-Si high temperature processes used in MEMS fabrication. Integrated mirror arrays in accordance with some embodiments include CMOS circuits that can withstand the high temperatures used during MEMS fabrication. The high temperature processing adversely impacts performance by increasing resistances of interconnects and leads; fortunately, the circuitry used to drive the mirrors has relaxed area requirements, as compared with modern CMOS circuits, because the desired mirror area provides a large area under the mirror compared with a very small area required for current state-of-the-art circuits, and because the mirrors operate at relatively low frequencies (e.g., less than 10 MHz).

FIGS. 7A through 7E depict a process sequence for forming Static Random Access Memory (SRAM) cells in accordance with one embodiment. This sequence is similar to a submicron CMOS process developed by Philips and described in "Semiconductor Memories, A Handbook of Design, Manufacture, and Application," by Betty Prince ($2^{nd}$ ed. 1997), which is incorporated herein by reference. The depicted sequence is modified, in accordance with one embodiment, to produce active circuit elements (e.g., isolated MOS or bipolar transistors) that can withstand the relatively high temperatures employed in poly-Si MEMS processing. SRAM cells are just some of the requisite active circuit elements required to control the MEMS mirror array. Other circuitry required to convert video signals into pixel control signals are well understood by those skilled in the art of display-device electronics. More functionality can be integrated in the CMOS part of the mirror array. These functions would include but are not be limited to MPEG-2, MPEG-4 decompression, JPEG decompression, YUV to RGB colorspace conversion, NTSC decoding, DTV decoding, HDTV decoding, and other display related functions.

Figure 7A:
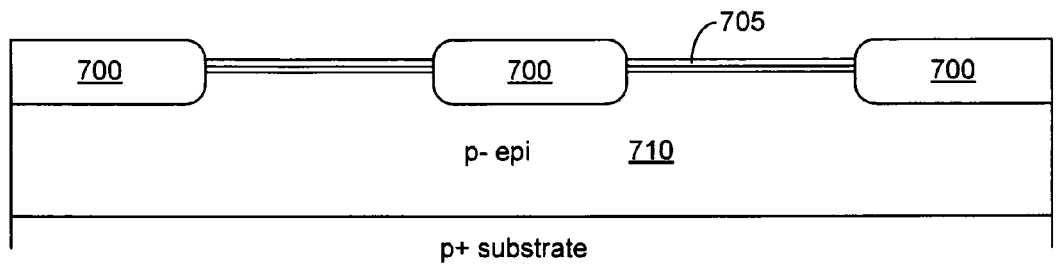
FIGS. 7A through 7E depict a process sequence for forming SRAM cells in accordance with one embodiment.
Figure 7B:
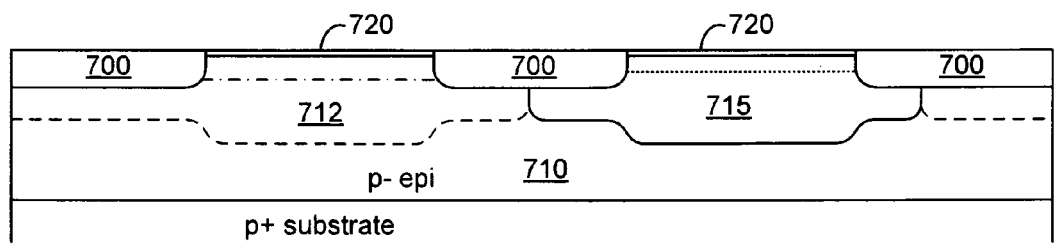

Referring first to FIG. 7A, a field oxide 700 is formed using a conventional local-oxidation of silicon (LOCOS) process. A sandwich layer 705 of silicon oxynitride and silicon nitride suppresses the formation of bird's beaks and lateral encroachment. Layers 700 and 705 are then planarized by a plasma etch back. The active regions 710 are protected by layer 705. The silicon nitride is then removed, leaving a substantially planar surface. Turning to FIG. 7B, a high energy graded ion implant is used to form twin well structures 712 and 715. A gate oxide layer 720 is grown during a high temperature implant anneal step.

Next, highly doped poly-Si 725 is deposited and patterned to form the gate regions of the transistors, the local interconnects, and the contacts to the sources and drains. An underlying TiW adhesive layer can be included to provide ohmic contacts to the source and drain regions. In some embodiments, a refractory metal is deposited over poly-Si layer 725, using conventional processes, to form polycide interconnect structures to reduce the resistance of local interconnects. The high dose n+ and p+ drain implants from the MOS transistors with lightly doped drain areas appearing under the edges of the gates as a result of earlier implants. The conductivity of the poly-Si layer can be increased (the resistivity reduced) by the inclusion of metals, such as molybdenum (Mo), tungsten (W), titanium (Ti), and cobalt (Co). In some embodiments, conductive layer 725 and the other later formed conductive layers exhibit resistivities less than $5 \times 10^{-6}$ ohms-cm.

Figure 7C:
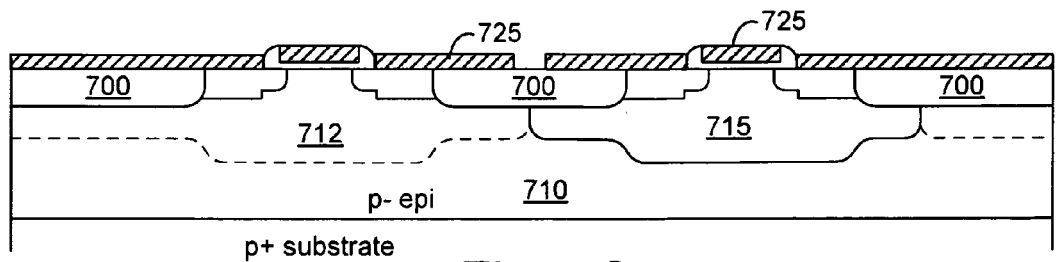
Figure 7D:
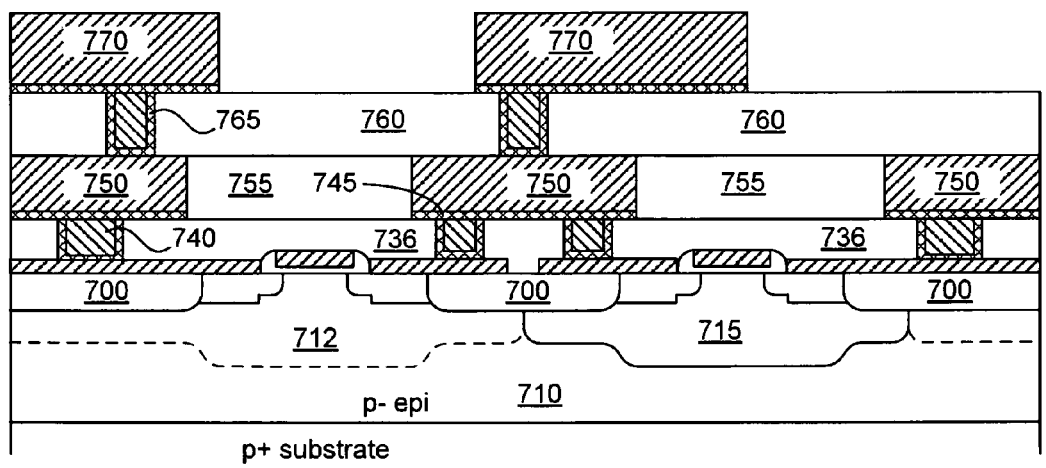

Turning to FIG. 7D, a layer of silicon dioxide 736 is deposited and planarized over the structure of FIG. 7C. Contact holes 740 are then cut and filled with tungsten (W) plugs using TiW as an adhesion layer. A second conductive layer is then patterned over the resulting structure. This conductive layer includes a TiW adhesive layer 745 over which is formed a doped poly-Si layer 750. A refractory metal may be deposited over poly-Si layer 750 to form polycide interconnect structures. The openings between features of layer 750 are then filled with a deposited oxide 755, such as spin-on glass. The features formed from layers 750 and 755 are then covered with another oxide layer 760 (e.g., TEOS), which is planarized in an etching step. Contact holes are then cut in layer 760 and filled with tungsten plugs 765 similar to plugs 740.

Figure 7E:
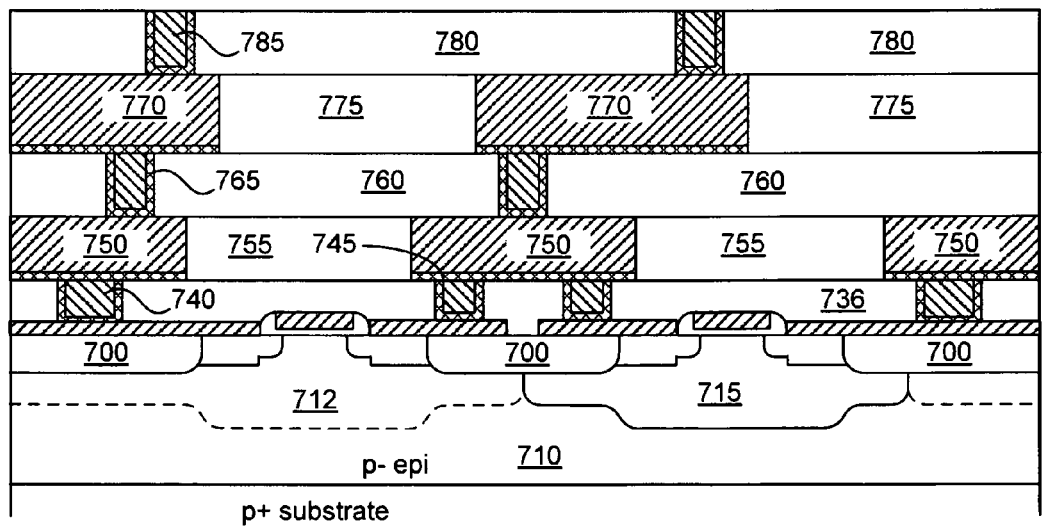

The third conductive layer 770 is then deposited and patterned, such as in the manner of layer 750. Turning to FIG. 7E, the openings between features of layer 770 are then filed with a deposited oxide 775. Yet another oxide layer 780 is then planarized and perforated with tungsten plugs 785, resulting in the structure depicted in FIG. 7E.

The structure of FIG. 7E is a portion of an embodiment of the substrate depicted in cross-section in FIG. 4A. The MEMS features formed in the sequence of FIGS. 4A-4Y can be fabricated over the structure of FIG. 7E, with plugs 785 providing the requisite electrical connectivity between the MEMS contacts and the underlying transistors. The third metal layer 770 is patterned to form conductive traces 402, and plugs 785 serve as conductive vias 403. The poly-Si or polycide interconnect layers exhibit far greater electrical resistance than do the metal interconnects employed in modern CMOS processes. In some embodiments, for example, the resistivity of one or more of the conductive layers is over $30 \times 10^{-6}$ ohms-cm. In contrast, the resistivity of aluminum and copper interconnect layers is far lower, typically less than $3 \times 10^{-6}$ ohms-cm. Layer 780 and via plug 785 (FIG. 7E) are omitted in some embodiments. For example, the stationary electrodes may be formed directly on top of the metal contact patterns 770 (FIG. 7E).

Some of the deleterious impact of the increased resistance may be offset, however, by increasing the cross-sectional area of interconnect structures that might otherwise adversely impact speed performance Increasing the cross-sectional area of interconnects and leads by a factor of four or five, for example, would provide adequate decrease of electrical resistance. Such increases can be accomplished with little or no impact on device area, as the mirror array places a lower limit on device area.

In contrast to more conventional structures, each of the conductive layers is formed of a material that can withstand the relatively high process temperatures (e.g., 900 to 1000 degrees Celsius) used to form poly-Si MEMS structures later in the manufacturing process. These embodiments thus facilitate the monolithic integration of control circuitry and MEMS actuators even with poly-Si as MEMS structural material. Such integration is accomplished using commercially available foundry processes, and important consideration in creating practical devices. Poly-Si, polycides, and poly-Si—Ge are all predominantly silicon, in terms of the relative proportion of atoms, and benefit from the thermal and mechanical properties of silicon and the extensive body of knowledge relating to the processing of silicon and silicon alloys.

Annealing is a key step in the manufacture of MEMS devices in accordance with poly-Si embodiments. Conventional processes use temperatures exceeding 1000 degrees Celsius for durations of up to 2 (two) hours to anneal poly-Si structures after each poly-Si deposition. Such high temperatures, especially over such considerable periods, will destroy conventional circuits that utilize aluminum and copper interconnects. The above-described multi-layer polycide processes provides transistors that are sufficiently heat tolerant to withstand subsequent high-temperature processing, and thus represent a major step toward the realization of commercial MEMS based products.

Rapid Thermal Annealing Process

Another embodiment employs a process that provides a low-risk approach to mitigating the high temperatures and long heating cycles used in conventional MEMS fabrication. CMOS circuit manufacturers have used rapid thermal annealing (RTA) to anneal the poly-Si layers used to fabricate Very Large Scale Integration (VLSI) chips with excellent results. This embodiment proposes to employ conventional RTA processes to anneal poly-Si structures used in MEMS devices. Processes in accordance with this embodiment reduce both the thermal shock to circuit structures and the cycle time required in the manufacture of the integrated circuit/MEMS devices. This embodiment advantageously results in lower mortality rates and thus higher yields and lower costs.

Three types of RTA can be employed in accordance with this embodiment—lamp exposure, excimer laser exposure, and femtosecond laser exposure. Applying one or more of these techniques over very short (e.g., a few seconds) exposures can provide adequate annealing without excessively heating, and consequently damaging, underlying circuitry (e.g., CMOS logic).

Preferred embodiments employ poly-Si—Ge instead of poly-Si for creating MEMS features. These embodiments can provide improved speed performance, reduced circuit area, or both. Poly-Si—Ge can be deposited at much lower temperatures than poly-Si (e.g., 400-450 degrees C.), so poly-Si—Ge MEMS devices are more compatible with conventional CMOS processes. This allows for more complex circuitry to be integrated into the micromirror array to produce devices with higher functionality e.g. built-in MPEG and JPEG decoding and decompression. When using poly-Si—Ge, annealing is not be required, or may be accomplished at relatively low temperatures, such as below 450 degrees Celsius. These low process temperatures permit the use of metal interconnects, including conventional Al—Si alloys or copper, and so are more compatible with conventional MOS and bipolar transistor fabrication processes, including the more popular CMOS processes. RTA processes can be used in combination with poly-Si—Ge MEMS features to further protect sensitive underlying drive electronics from excessive temperatures.

Tungsten and Poly-Si—Ge

In the process described above in connection with FIGS. 7A through 7E, poly-Si and polycides provide interconnect structures that withstand high temperatures. Other embodiments use tungsten metallization for underlying circuitry and poly-Si—Ge for MEMS structures. In such embodiments, MEMS structural layers (e.g., to form comb electrodes) can be deposited at temperatures 400-700 degrees Celsius while tungsten can be exposed safely to temperatures up to 900 degrees Celsius. Tungsten may be deposited using a number of well-know deposition techniques, such as sputtering, thermal evaporation, e-beam evaporation or chemical vapor deposition.

Germanium or PECVD Silicon Dioxide

Selecting an appropriate sacrificial material for creating MEMS structures is important when using poly-Si—Ge for MEMS fabrication. Typically oxides (e.g. $SiO_2$) are used to define these sacrificial layers (which are etched away), but the etchants (Hydrofluoric HF acid, or HF) used in the final etch partially remove silicon nitride protecting underlying circuit features (e.g. metals, oxides). Another embodiment employs poly Si—Ge as the structural material and pure Ge as the sacrificial material, which removes the need for an HF acid release etch.

When silicon dioxides are used as sacrificial layers, they are typically deposited by thermal oxidation which leads to high temperatures and high compressive stresses. PECVD silicon oxide can be deposited at temperatures between 100 and 400 degrees Celsius and its stress can be minimized by control of deposition conditions, thus further improving thermal management during MEMS fabrication. Some embodiments thus use PECVD silicon dioxide as the sacrificial material. A germanium layer above the CMOS circuitry can be included as an etch stop layer for protection of CMOS devices.

The present invention has been described in connection with a number of specific embodiments, including:

a. a high temperature option with tungsten or other refractive material used for interconnects and vias in electronics, thermal silicon dioxide as sacrificial MEMS material and thermally annealed poly-Si as structural MEMS material;

b. an intermediate temperature option with poly-Si or refractive materials used for interconnects and vias in electronics, plasma enhanced or low temperature silicon dioxide as sacrificial MEMS material and poly-Si processed by rapid thermal annealing or poly-Si—Ge as structural MEMS material;

c. a low temperature option with conventional CMOS having aluminum or copper metallization, low temperature or plasma enhanced silicon dioxide as sacrificial MEMS material and poly-Si—Ge as structural MEMS material; and d. a near room temperature option with conventional CMOS having aluminum or copper metallization, photoresist or other polymers as sacrificial MEMS material and metal or metal alloys as structural MEMS material.

However, variations of these embodiments will be obvious to those of ordinary skill in the art. For example:

a. Only two types of memory cells are depicted above. Many other types of memory cells are well known, and can be used in place of the ones shown. Specific examples include (1) SRAM cells with 4 transistor (4T) structures and poly-Si load resistors, which would allow the SRAM cells to use only N-channel MOS devices and poly-silicon for the electrodes and power and ground buss; and (2) 4T SRAM cells with poly-silicon capacitors.

b. In addition to the exemplary CMOS circuitry, other types of circuitry, including other flavors of CMOS, NMOS, and bipolar circuitry can be used.

c. Other structural and sacrificial materials can be used for the MEMS structures. Some embodiments employ e.g. beryllium copper as a structural material and photoresist as a sacrificial material.

Moreover, some components are shown directly connected to one another while others are shown connected via intermediate components. In each instance the method of interconnection, or "coupling," establishes some desired electrical communication between two or more circuit nodes (e.g., circuit terminals, lines, pads, ports). Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. An integrated light modulator comprising:
   a. a plurality of active circuit elements;
   b. a first conductive layer, including a first plurality of conductive traces, patterned over and in electrical contact with the active circuit elements;
   c. a first insulating layer formed over the first conductive layer;
   d. a second conductive layer, including a second plurality of conductive traces, patterned over the first insulating layer and in electrical contact with the active circuit elements, wherein the second conductive layer has a resistivity of at least $5 \times 10^{-6}$ ohms-cm; and
   e. a second insulating layer formed over the second conductive layer.

2. The light modulator of claim 1, further comprising a MEMS actuator disposed over the second insulating layer and in electrical contact with the active circuit elements via the first and second conductive layers.

3. The light modulator of claim 2, further comprising a third conductive layer, including a third plurality of conductive traces, disposed between the second insulating layer and the MEMS actuator.

4. The light modulator of claim 2, wherein the MEMS actuator comprises a mirror.

5. The light modulator of claim 1, wherein the first and second conductive layer are predominately silicon.

6. The light modulator of claim 5, wherein the second conductive layer comprises at least one of Mo, W, Ti, and Co.

7. The light modulator of claim 1, wherein the second conductive layer comprises at least one of Mo, W, Ti, and Co.

8. The light modulator of claim 1, further comprising a MEMS actuator disposed over the second insulating layer and in electrical contact with the active circuit elements via the first and second conductive layers, wherein the MEMS actuator includes an array of mirrors, each mirror including a movable electrode.

9. The light modulator of claim 8, wherein the movable electrode exhibits a fracture strength of at least 1 GPa.

10. The light modulator of claim 9, wherein the movable electrode is predominantly silicon.

11. The light modulator of claim 9, wherein the movable electrode comprises germanium.

12. The light modulator of claim 1, wherein the resistivity of the second conductive layer is at least $30 \times 10^{-6}$ ohms-cm.

13. The light modulator of claim 1, further comprising a MEMS actuator disposed over the second insulating layer and in electrical contact with the active circuit elements via the first and second conductive layers, wherein the MEMS actuator includes a hinge.

14. The light modulator of claim 13, wherein the hinge exhibits a fracture strength of at least 1 GPa.

15. The light modulator of claim 14, wherein the hinge is predominantly silicon.

16. The light modulator of claim 1, wherein at least some of the active circuit elements make up a display engine, and wherein the display engine performs at least one of MPEG decompression, JPEG decompression colorspace conversion, NTSC decoding, DTV decoding, and HDTV.

17. The light modulator of claim 1, wherein the active circuit elements are MOS circuit elements.

* * * * *